(12) United States Patent
Imtiaz

(10) Patent No.: US 7,987,085 B2
(45) Date of Patent: Jul. 26, 2011

(54) METHOD OF ACCURATE PREDICTION OF ELECTROSTATIC DISCHARGE (ESD) PERFORMANCE IN MULTI-VOLTAGE ENVIRONMENT

(75) Inventor: S. M. Sohel Imtiaz, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 623 days.

(21) Appl. No.: 12/032,624

(22) Filed: Feb. 15, 2008

(65) Prior Publication Data

US 2009/0210210 A1 Aug. 20, 2009

(51) Int. Cl.
*G06F 17/50* (2006.01)
(52) U.S. Cl. .................. 703/14; 361/91.1; 257/355
(58) Field of Classification Search .............. 703/13, 703/14; 716/4, 5; 324/713; 361/56, 91.1; 257/355, 379
See application file for complete search history.

(56) References Cited

U.S. PATENT DOCUMENTS

| | | | |
|---|---|---|---|
| 6,700,164 B1* | 3/2004 | Brennan et al. .............. 257/379 |
| 7,205,613 B2* | 4/2007 | Fjelstad et al. .............. 257/355 |
| 2004/0239346 A1* | 12/2004 | Iyer et al. .............. 324/713 |
| 2004/0243949 A1* | 12/2004 | Wang et al. .............. 716/4 |
| 2005/0065762 A1* | 3/2005 | Hayashi .............. 703/14 |
| 2005/0125751 A1* | 6/2005 | Miller et al. .............. 716/4 |
| 2005/0172246 A1* | 8/2005 | Logie et al. .............. 716/4 |
| 2005/0185351 A1* | 8/2005 | Miller et al. .............. 361/56 |
| 2005/0201031 A1* | 9/2005 | Furuta .............. 361/91.1 |
| 2006/0001100 A1* | 1/2006 | Kamei et al. .............. 257/355 |
| 2006/0109596 A1* | 5/2006 | Hayashi .............. 361/56 |
| 2007/0165344 A1* | 7/2007 | Esmark et al. .............. 361/56 |
| 2008/0043390 A1* | 2/2008 | Yoshitani et al. .............. 361/56 |
| 2008/0104554 A1* | 5/2008 | Kobayashi et al. .............. 716/4 |
| 2008/0148199 A1* | 6/2008 | Bell et al. .............. 716/5 |

OTHER PUBLICATIONS

Amerasekara et al., "Failure modes, reliability issues and case studies", ESD in silicon integrated circuits, 2002.*
A. Z. Wang, H.G. Feng, K. Gong, R. Y. Zhan, J. Stine, "On-chip ESD Protection design for integrated circuits: an overview for IC designers", pp. 733-747, Microelectronic Journal, May 2001.
Hirokazu Hayashi, Toshikazu Kuroda, Katsuhiro Kato, Koichi Fukuda, Shunsuke Baba, and Yasuhiro Fukuda, "ESD Protection Design Using a Mixed-Mode Simulation for Advanced Devices", EOS/ESD Symposium Digest 2004.
H. Feng, G. Chen, R. Zhan, Q. Wu, X. Guan, H. Xie, A. Z. Wang, R. Gafiteanu, "A Mixed-Mode ESD Protection Circuit Simulation-Design Methodology", pp. 995-1006, IEEE Journal of Solid-State Circuits, Jun. 2003.

* cited by examiner

*Primary Examiner* — Kandasamy Thangavelu
(74) *Attorney, Agent, or Firm* — Sawyer Law Group, P.C.

(57) ABSTRACT

The present invention relates generally to semiconductor wafer fabrication and more particularly but not exclusively to predictive, pre-fabrication methodologies for determining inefficiencies in an integrated circuit (IC) design. The present invention, in one or more implementations, provides an effective pre-production methodology for predicting the efficiency and behavior of a designed ESD protective circuit and testing the ESD protective circuit with a simulated IC. The method of the present invention yields predictive results that have been comparatively tested.

25 Claims, 6 Drawing Sheets

100

200

500

METHOD OF ACCURATE PREDICTION OF ELECTROSTATIC DISCHARGE (ESD) PERFORMANCE IN MULTI-VOLTAGE ENVIRONMENT

FIELD OF THE INVENTION

The present invention relates generally to semiconductor wafer fabrication and more particularly but not exclusively to predictive, pre-fabrication methodologies for determining inefficiencies in an integrated circuit (IC) design.

BACKGROUND OF THE INVENTION

Demand for semiconductors, wafers, integrated circuits and semiconductor devices (i.e., collectively "semiconductors") continues to rapidly increase. With the continued market demand, there remain market pressures to increase the number of wafers that can be processed, reduce the geometries of finished wafers and their associated chip footprints, and increase component counts in the reduced geometries. Being able to sustain and meet the market demands with a reliable and consistent offering is a challenge however, in part because wafer manufacture is an environment that is both process sensitive and equipment intensive. Similarly, since wafer fabrication is an expense process, determining as early as possible potential problems or limitations of a planned circuit design are desired.

The fabrication of wafers (i.e., fabrication, fab, or fab environment) is costly and requires advanced processing equipment, unique toolings, and extensive research and testing efforts. Testing of semiconductor devices (i.e., integrated circuits, wafers, or ICs) often includes random but costly electrostatic discharge (ESD) testing on final produced wafers to assess their ability to withstand a planned voltage threshold. In certain situations, an IC and a complement ESD protective circuit are planned to be integrated (i.e., paired) for post-production use. In these pairings, the ESD protective circuit is often designed for a specific voltage threshold and the IC is separately designed for its intended end use. However, in certain cases and more particularly for a multi-voltage IC, though a paired ESD circuit may be a well-designed stand alone protective circuit, when integrated with an IC, the resulting ESD protection to the IC may be non-existent. Unfortunately since failures detected at this stage of testing, at the integration and post-integration level, occur well-after tape out, costs associated with the design and production planning have already been expended. The results of such failures also require further costly design assessment, additional design and pre-production iterative analyses, and continued delays in production. Alternatively, testing of an ESD protective circuit alone has proven ineffective, thereby requiring the IC to be first produced to provide an accurate test result.

It remains widely recognized that ESD as a potential source of damage, especially to semiconductor devices, is a critical and costly matter. ESD events are recognized as a significant contributor of early life failures of a semiconductor device. It is understood that when two objects come in contact with each other, a triboelectric action between them may generate an electrical energy charge that initiates an ESD event. The sudden release of generated charge in an object or person can produce extremely high voltages, currents, and electromagnetic fields that can result in malfunctioning, altering of device parameters, or even destruction of silicon junctions. While there are understood to be a variety of ESD events and types, by example, an ESD event in a human body is believed to generate static charge levels up to 15,000 volts by walking across carpet and up to 5,000 volts by walking across linoleum. Therefore avoiding the production of designs susceptible to ESD damage and inaccurate ESD protective circuit pairing is highly desired.

Accordingly, it is desired to determine an effective pre-production methodology for predicting the efficiency and behavior of a designed ESD protective circuit and testing the ESD protective circuit with a simulated IC. The present invention, in accordance with its various implementations herein, addresses such needs.

SUMMARY OF THE INVENTION

In one implementation of the present invention, the present invention is a method of predicting effectiveness of an electrostatic discharge (ESD) circuit using a program simulator and an ESD model, comprising: populating characteristics of the ESD model and an associated semiconductor device into the program simulator, determining a minimum current threshold for the ESD model, executing the program simulator to determine the simulated current across the ESD model as between one or more predetermined circuit paths, and, comparing the determined simulated current to the minimum current threshold.

In another implementation, the present invention is a method of estimating current leakage of an electrostatic discharge (ESD) circuit using a program simulator, comprising: populating characteristics of a Human Body Model (HBM), a designed ESD device in communication with the HBM, and an associated semiconductor device under test (DUT), into the program simulator, simulating current flow across at least two or more circuit paths as between a positive supply voltage (VCC) of the HBM and the ground point, a first input/output (I/O) point and a second I/O point of the DUT, and one of the I/O points of the DUT and the ground point, and determining a current leakage as an average difference between the simulated current flow across at least two or more circuit paths and a maximum current threshold for the DUT.

In a further implementation of the present invention, a computer program product for passing or failing an electrostatic discharge (ESD) circuit using a program simulator and an ESD model, is provided.

DETAILED DESCRIPTION

The present invention relates generally to semiconductor wafer fabrication and more particularly but not exclusively to predictive, pre-fabrication methodologies for determining inefficiencies in an IC design.

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

In order to effectively predict real world scenarios involving possible ESD events, it is necessary to determine the effectiveness of a design of an ESD protective circuit. It is understood that there are few real world models recognized for determining ESD effectiveness, including: the Human Body Model (HBM), the Machine Model (MM), and the Charged Device Model (CDM) (collectively "models" or "ESD models" as used herein).

The HBM is an advantageous model for one or more implementations of the present invention, though the other models may also be understood to provide superior results in various implementations herein over prior ineffective efforts.

In one or more implementations herein, a methodology using a program simulation is implemented to simulate a model, such as the HBM reflecting an estimated human voltage (HV), and an ESD protective circuit design, prior to production. Using the methodology with the program simulation, the ESD protective circuit (i.e., device) is tested to withstand the HV while carrying an expected current (EC). For the HBM, under various conditions, the human body is effectively charged with electrical energy and the human body charge is transferred to a semiconductor device through normal handling or assembly operations. The HBM pulse is intended to simulate the human body type ESD conditions the IC or semiconductor part would experience during normal usage.

Using the present invention, an evaluation of the effectiveness of the ESD protection circuitry alone, in, or in combination with an integrated circuit, can be predicted and determined.

Figure 1:
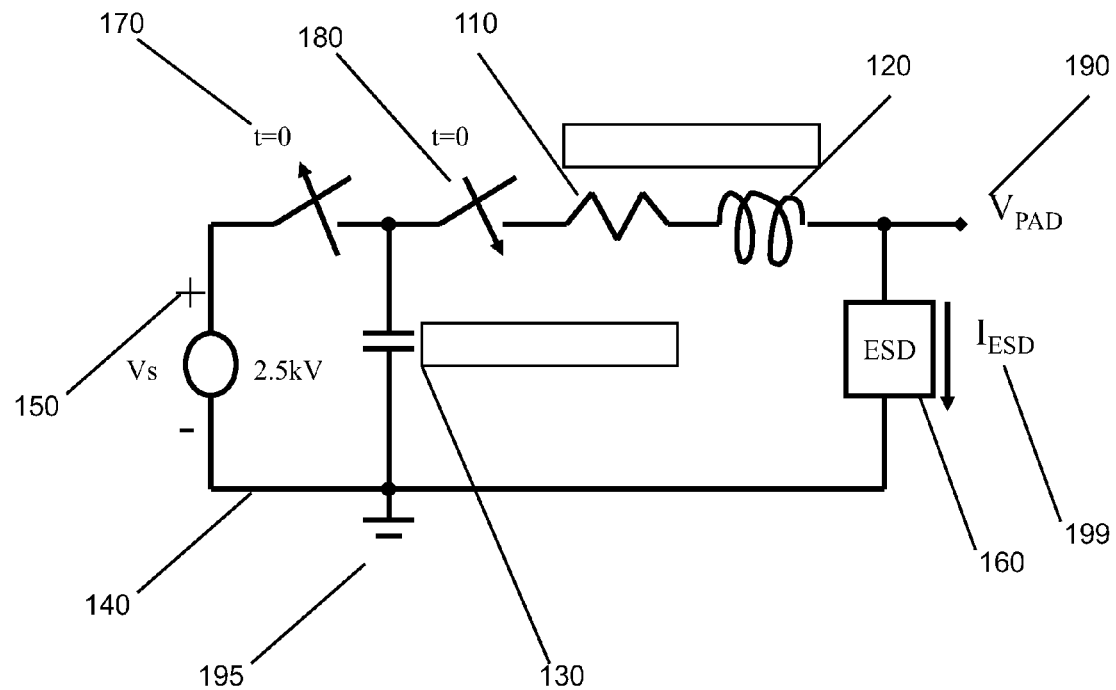
FIG. 1 depicts an ESD protective circuit with elements in an HBM arrangement which is simulated, in accordance with an implementation of the present invention.

FIG. 1 depicts an ESD protective circuit 100 with elements in an HBM arrangement which is simulated, in accordance with an implementation of the present invention. From FIG. 1, the ESD protective circuit 100 is arranged in a resonant or second-order circuit relationship (RLC) consisting of a resistor 110 (R), an inductor 120 (L), and a capacitor 130 (C), configured in circuit communication along the circuit 140. Analogously, R corresponds to the body resistance, L corresponds to body inductance, and C is the capacitance of the body with respect to its surroundings. In various implementations, it will be appreciated that a body capacitance may typically range from 80 to 300 pF (pico Farad), a body resistance may range from 800 to 3000 ohms, and a body inductance may range from near zero to 15 µH (micro Henrys). In a preferred implementation, the following ranges are desired: a body capacitance C of 100 to 250 pF, a body resistance R of 1000 to 2000 ohms and a body inductance L of 6 to 8 uH.

In a further preferred implementation, the capacitance C (130) is 100 pf and is charged by a power source ($V_S$) (150) to 2.5 kV and applied to the ESD protective circuit 160 at a time of t=0, and a resulting 1.6 A current of HBM current (EC) is generated and which traverses the ESD device at current at 199. At time t=0, switch 170 is open and switch 180 is closed. Input voltage ($V_{PAD}$) 190 is not connected to an input source in FIGS. 1 and 195 represents a ground connection to the circuit 100. It will be understood by those skilled in the art that $V_S$ may be of a value different than that represented above, as $V_S$ is intended to demonstrate an approximate HBM maximum voltage threshold. Accordingly, the associated amperage of current (EC) resulting from an HBM would also be relationally adjusted. In one or more implementations, a program simulator is utilized to effect the methodology and determine in a simulation the success or failure of the tested ESD protective circuit.

While the program simulator may be any software, machine code, or circuit simulator tool, in one or more preferred implementations, a preferred program simulator is a modified SPICE (Simulation Program with Integrated Circuit Emphasis). SPICE is a general purpose analog electronic circuit simulator, developed at the Electronics Research Laboratory of the University of California, Berkeley. For the present invention, in relation to SPICE and the device models for the simulation in accordance with the methodology, certain modifications to SPICE are necessary to ensure informative simulation results. For instance, as the current SPICE model deck does not include breakdown information for MOSFET and Bipolar devices, a modified or customized model deck is set forth in one or more implementation which includes all associated junction and oxide breakdowns of tested devices, via a diode, which would not otherwise influence any characteristics other than providing breakdown voltage and leakage current. Operationally, SPICE has certain built-in models for semiconductor devices such that a user sets forth only the pertinent model parameter values. For instance, charge storage effects, ohmic resistances, and a current-dependent output conductance may be included, and a diode model can be used for either junction diodes or Schottky barrier diodes.

Figure 2:
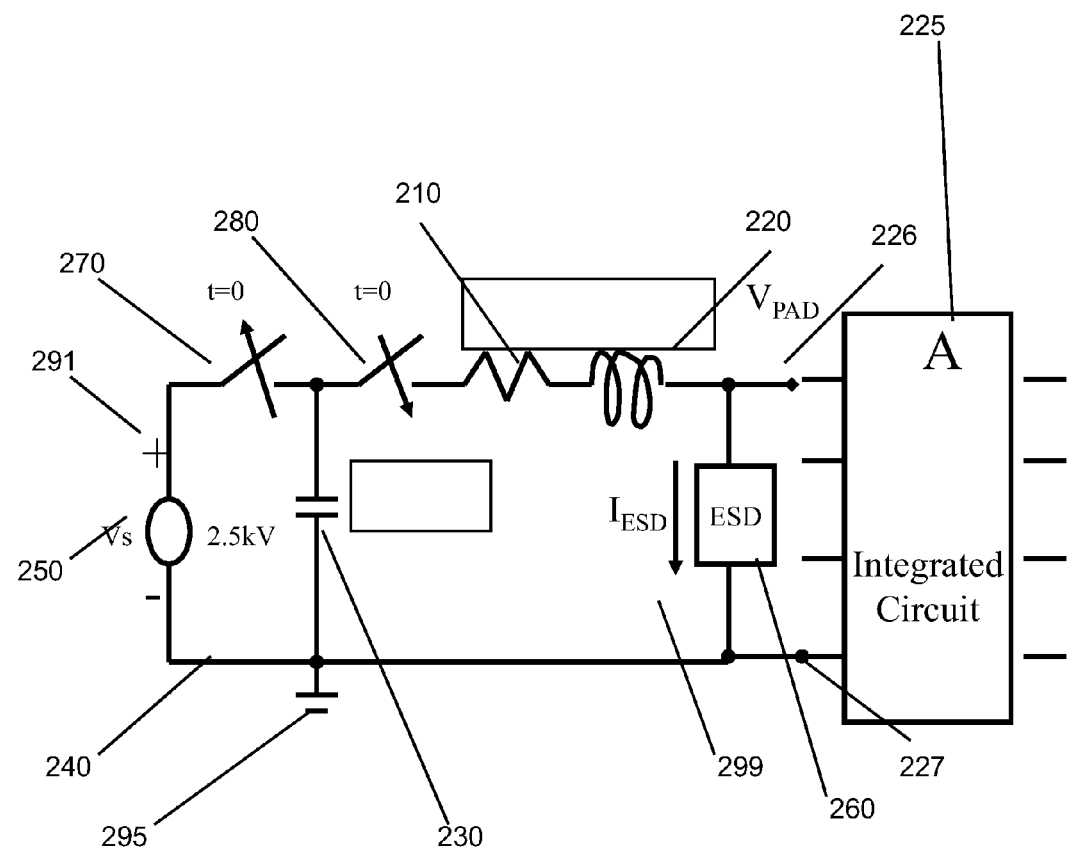
FIG. 2 depicts an ESD protective circuit connected with an IC, in accordance with an implementation of the present invention.

FIG. 2 depicts an ESD protective circuit 200 connected with an IC, in accordance with an implementation of the present invention. From FIG. 2, the ESD protective circuit 200 is arranged in a resonant or second-order circuit relationship (RLC) consisting of a resistor 210 (R), an inductor 220 (L), and a capacitor 230 (C), configured in circuit communication along the circuit 240. An IC (225) is connected to the ESD protective circuit 200 at two pin locations (226 and 227). In a preferred implementation, characteristics of the ESD protective circuit include: the capacitance C (230) is 100 pf and is charged by a power source ($V_S$) (250) to 2.5 kV and applied to the ESD protective circuit 260 at a time of t=0, and a resulting 1.6 A current (EC) is generated. At time t=0, switch 270 is open and switch 280 is closed. 295 represents a ground connection to the circuit 200.

In FIG. 2, the effectiveness of the ESD protective device is tested by the arrangement of the circuit with the IC 225. In one or more implementations, at time t=0, a 1.6 A current of HBM equivalent (EC) is tested to determine if the entire 1.6 A current flows through the ESD protective circuit 260.

In one or more implementations of the present invention, a determination of the flow of current across the ESD protective circuit is assessed across at least two of three circuit paths including circuit paths between the positive supply voltage ($V_{CC}$) (291) and the ground point 295, a first input/output (I/O) pin 226 and a second I/O pin 227, and one of the I/O pins (226 or 227) and the ground point 295. Where it is determined that approximately 100 µA or more of current is flowing across at least two of the three circuit paths above, it is determined by the present invention that current flow through the ESD protective circuit is unacceptably significant and that the tested ESD protective circuit fails.

In one or more implementations of the present invention, a program simulation is employed to simulate the HBM, EC and $V_S$, and further simulates current flows across three circuit paths as between the positive supply voltage (VCC) (291) and the ground point 295, a first input/output (I/O) pin 226 and a second I/O pin 227, and one of the I/O pins (226 or 227) and the ground point 295. The program simulation is then able to determine whether the simulated ESD protective circuit passes or fails the ESD testing in relation to the amount of current measured across two of more of the circuit paths. Where the measured current across two or more circuit paths exceeds 100 µA, the program simulation fails the ESD protective circuit.

Figure 3:
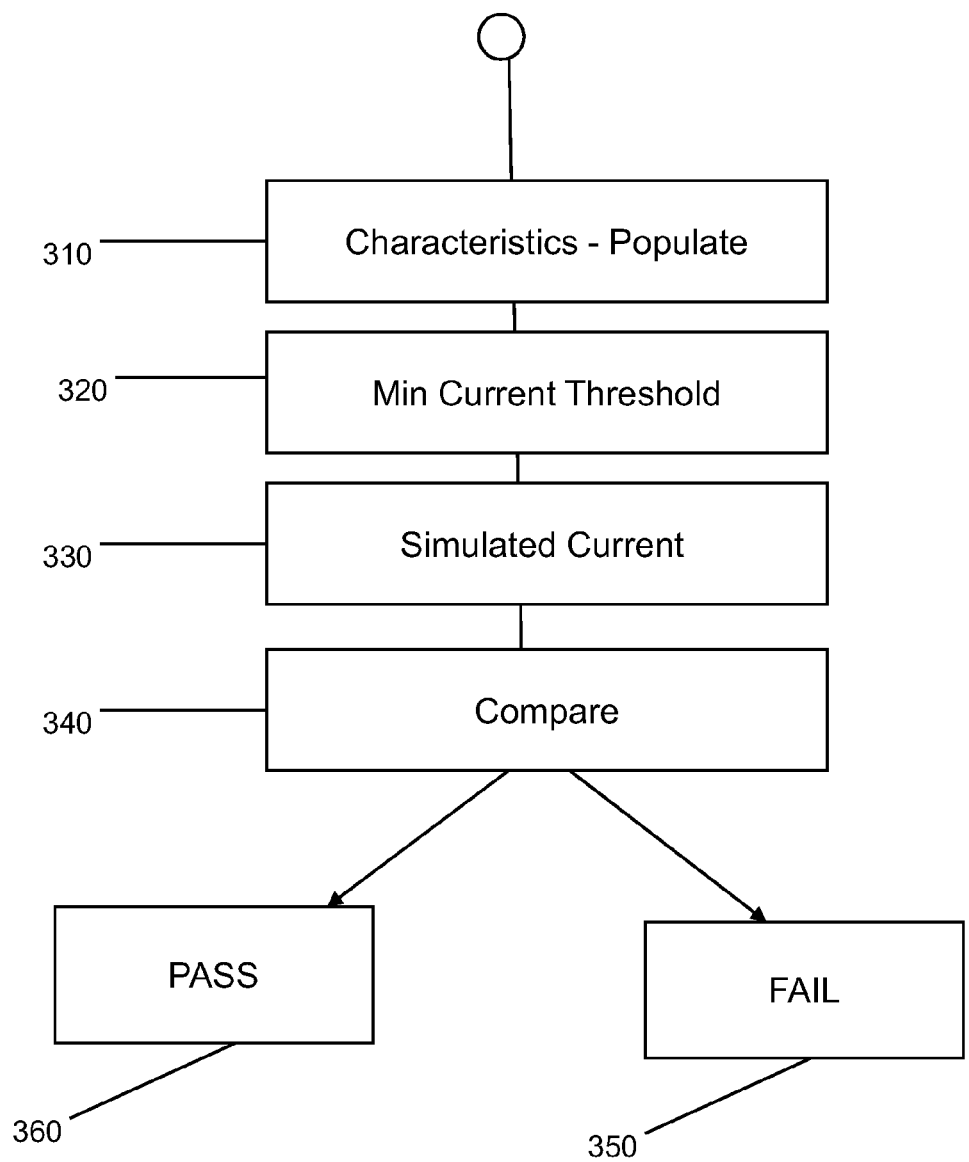
FIG. 3 depicts a flow chart of the method of the present invention in accordance with one or more implementations.

FIG. 3 depicts a flow chart of the method 300 of the present invention in accordance with one or more implementations.

From FIG. 3, the method of predicting effectiveness of an electrostatic discharge (ESD) circuit 300 includes using a program simulator (not shown) to perform the method. At 310, information such as characteristics of the ESD circuit being assessed using an implementation of the present invention is identified and populated into the program simulator. For instance, at 310, information regarding the HBM parameters as well as ESD circuit or ESD devices are provided. At 320, a determination for a minimum current threshold for the ESD model is made using the inputted information regarding the ESD model, where the ESD model may be any one of the models. At 330, the program is executed to determine the simulated current across the ESD model as between one or more predetermined circuit paths. The predetermined circuit paths are understood to include but not be limited by those discussed previously. At 340, the determined simulated current is compared to the minimum current threshold by the program simulation. At 350, a FAIL state is returned where the determined simulated current is significantly less than the minimum current threshold or, at 360, a PASS state is returned where the determined simulated current is equal or very close to the minimum current threshold.

Figure 4:
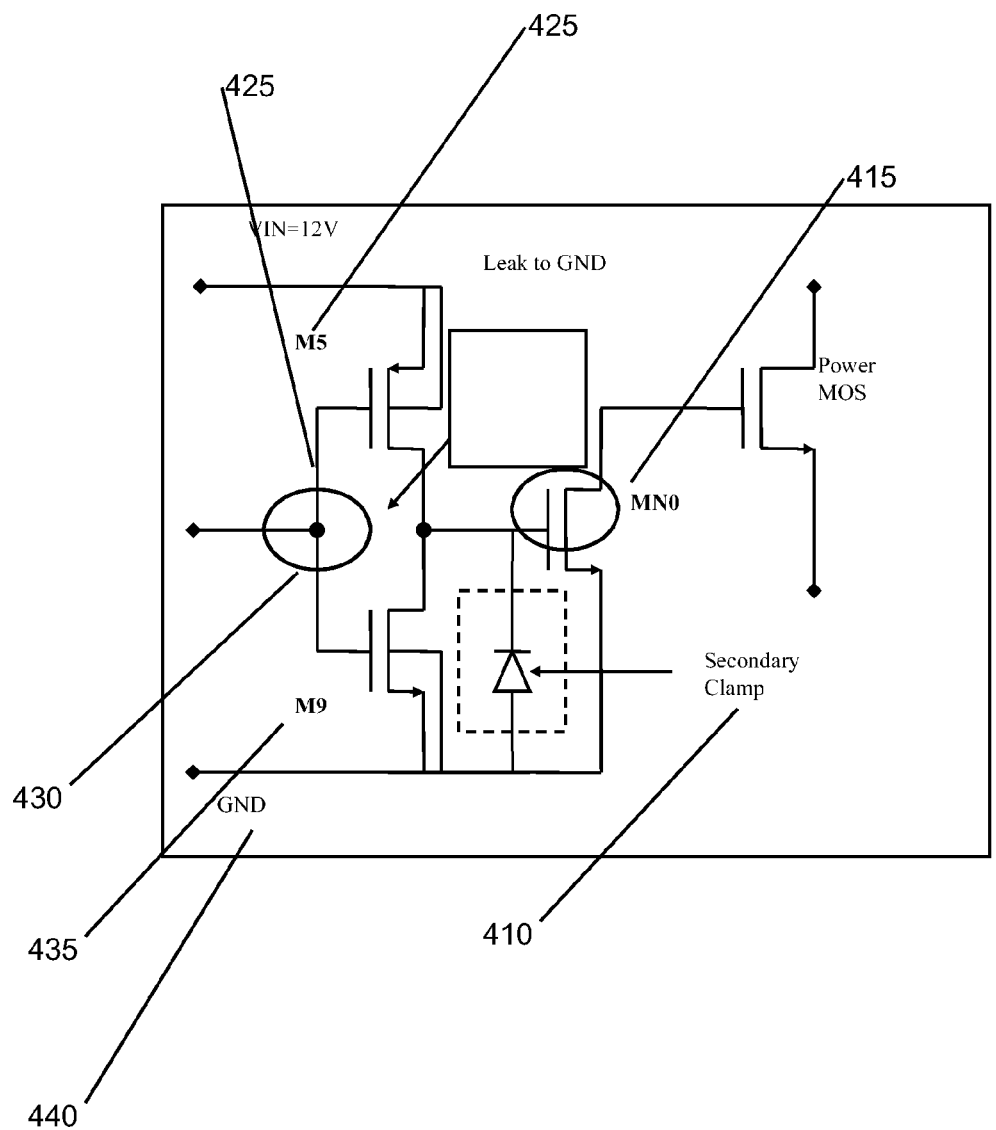
FIG. 4 shows a portion of a circuit used in a hot swap controller chip, tested using the present invention in one or more implementations.

FIG. 4 shows a portion of a circuit 400 used in a Hot Swap Controller chip, tested using the present invention in one or more implementations.

From FIG. 4, an ESD simulation using the present invention was performed on the circuit 400 resulting in a determination that a much higher voltage than desired was developed at two or more of the gates (i.e., circuit paths) as between the positive supply voltage ($V_{CC}$) and the ground point, a first input/output (I/O) pin and a second I/O pin, and one of the I/O pins and the ground point. The determination that there was higher voltage than desired concludes that electrical overstress and eventual leakage would likely result with the design. Following the results from the present invention, a further analysis identifies that using a secondary clamp (as shown) 410 at the gate of MN0 (415), adding a 200 ohm resistance (420) at the source of PMOS transistor M5 (425), adding a 200 ohm resistance (430) at the gate of M9 (435), and adopting localized grounding of each block (440), provides a successful solution to the original design. Further testing using the present invention yielded findings that the revised design was suitable.

Figure 5:
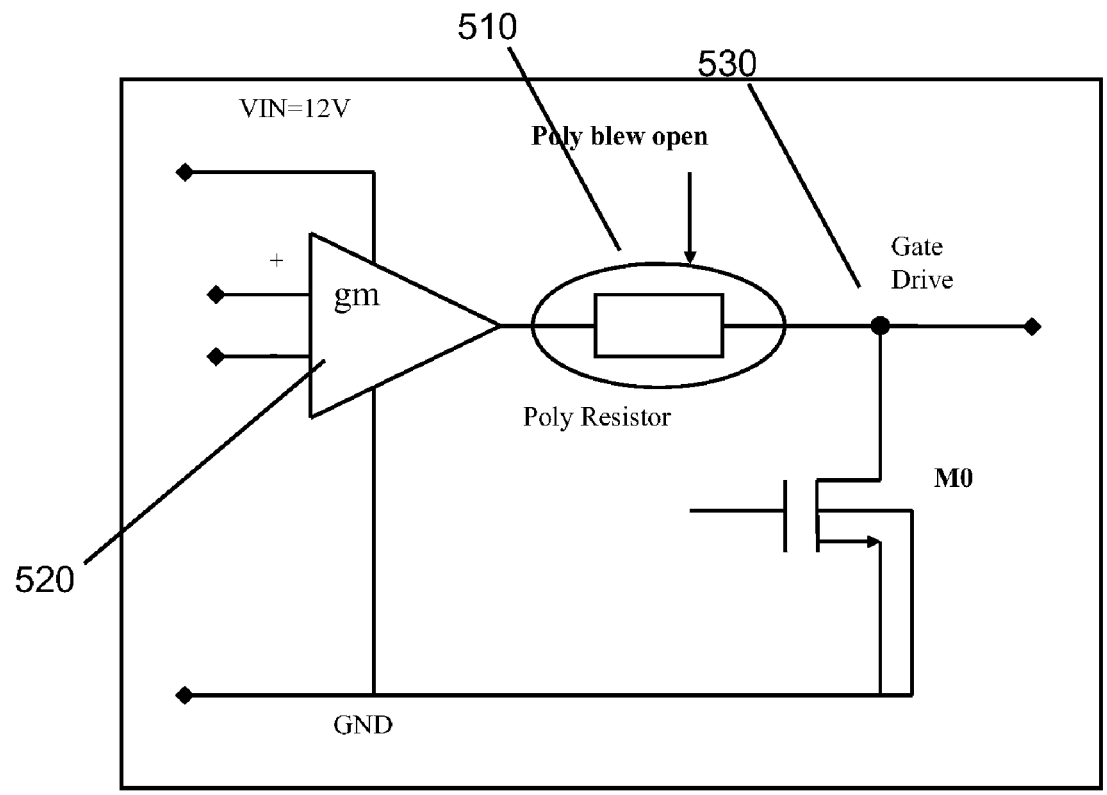
FIG. 5 depicts a portion of a gate-driver circuit, tested using the present invention in one or more implementations; and, FIG. 6 shows a simulation setup for a multi-voltage chip using an implementation of the present invention with a program simulation.

FIG. 5 depicts a portion of a gate-driver circuit 500, tested using the present invention in one or more implementations. From FIG. 5, the gate driver section 500 depicts an area where a poly resistor 510 is connected between the Gm amplifier block 520 and the gate driver node 530. ESD simulation using the present invention demonstrates and predicts a high power dissipation in the resistor 510 where a single (1×) resistor fails but a quintuple (5×) resistor passes. To further test the results of the (Fab 5). During actual ESD zapping, the poly resistor 510 blew due to high energy dissip present invention, the circuit was fabricated as designed with a single resistor (Fab 1) and was also fabricated with a 5-times higher poly resistor ated across it in the Fab 1 configuration but the poly resistor 510 did not fail for the Fab 5 design. The simulation results were confirmed by tested results.

Figure 6:
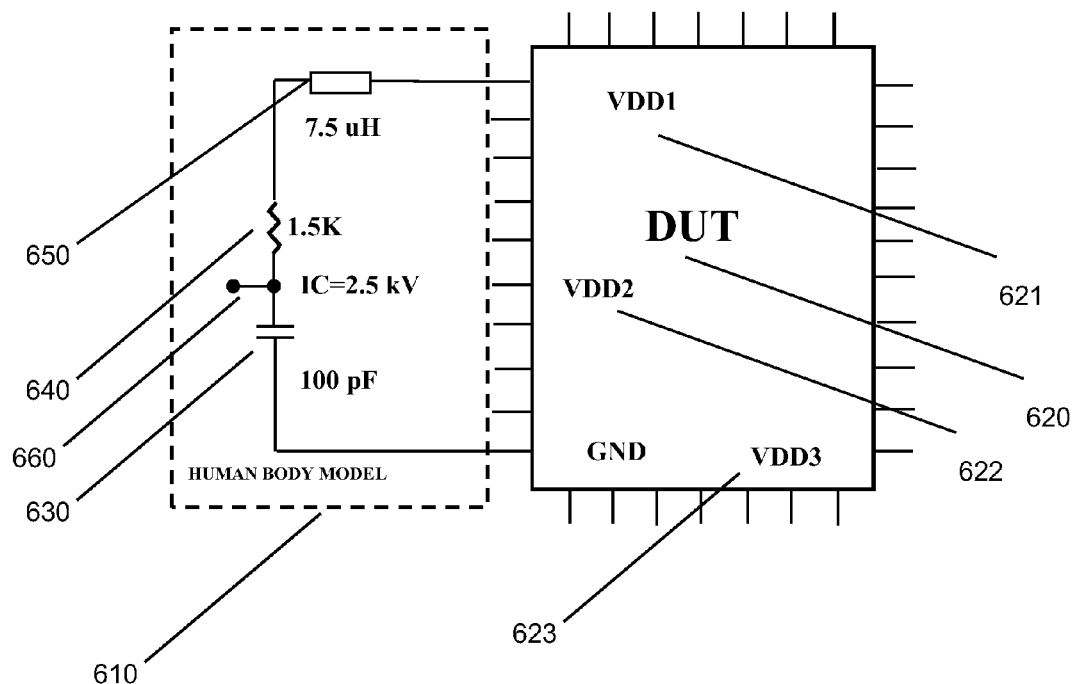

FIG. 6 shows a simulation setup 600 for a multi-voltage chip using an implementation of the present invention with a program simulation. From FIG. 6, a HBM 610 is arranged with a Device Under Test (DUT) (620), such as a multi-voltage IC, having chip voltage node points ($V_{DD}$) (621, 622, 623). The method provides simulation results using the parameters of the HBM elements (capacitance (630), resistance (640), inductance (650) and input voltage (660)) in arrangement with the tested IC. In the arrangement of FIG. 6, where the environment (HBM) approximates 15V and the IC is a 5V device, the simulation will predict failure of the ESD performance absent any clamp diode or extra protection. The simulation of the present invention will also predict the 5V device will breakdown and demonstrate substantial leakage.

Advantageously, the present invention, in one or more implementations, improves design cycle time, assists the designer in identifying weak links in the design, provides a cost-effective approach to a costly problem, and improves the probability of a first-silicon success for fabrication.

As used herein, it is envisioned that the present invention in one or more implementations may be hardware, software, firmware, or combinations thereof, in its composition and operation, and may therefore further comprise software, instructional code, other applications, and be a computer program product.

Various implementations of an effective pre-production methodology for predicting the efficiency and behavior of a designed ESD protective circuit and testing the ESD protective circuit with a simulated IC have been described. Nevertheless, one of ordinary skill in the art will readily recognize that various modifications may be made to the implementations, and any variations would be within the spirit and scope of the present invention. For example, the above-described process flow is described with reference to a particular ordering of process actions. However, the ordering of many of the described process actions may be changed without affecting the scope or operation of the invention. Accordingly, many modifications may be made by one of ordinary skill in the art without departing from the spirit and scope of the following claims.

What is claimed is:

1. A method of predicting effectiveness of an electrostatic discharge (ESD) circuit using a program simulator and an ESD model, comprising:

populating characteristics of the ESD model and an associated semiconductor device into the program simulator, determining a minimum current threshold for the ESD model, executing the program simulator to determine the simulated current across the ESD model as through two or more predetermined circuit paths, and, comparing the determined simulated current of the two or more circuit paths to the minimum current threshold, wherein if a current through the two or more circuit paths is above the minimum current threshold the current is unacceptably significant and the ESD circuit fails.

2. The method of claim 1, wherein the ESD model further comprises an ESD circuit and one of a Human Body Model (HBM), a Machine Model (MM), or a Charged Device Model (CDM).

3. The method of claim 1, wherein the ESD model is a Human Body Model (HBM) in communicative arrangement with an ESD circuit, and the semiconductor device is an integrated circuit (IC) design having IC characteristics.

4. The method of claim 3, further comprising, returning a FAIL state where the determined simulated current through the ESD circuit is significantly less than the minimum current threshold or returning a PASS state where the determined simulated current is equal or very close to the minimum current threshold.

5. The method of claim 3, further comprising, returning a PASS state where the determined simulated current through the ESD circuit is no more than approximately 10 micro amps less than the minimum current threshold.

6. The method of claim 3, wherein the one or more predetermined circuit paths are as between the positive supply voltage ($V_{CC}$) of the ESD circuit and the ground point, a first input/output (I/O) point and a second I/O point of the IC, and one of the I/O points of the IC and the ground point.

7. The method of claim 3, wherein characteristics of the HBM model include a resistor (R), an inductor (L), and a capacitor (C), configured in circuit communication where C is approximately in a range from 80 to 300 pF, R is approximately in a range of 800 to 3000 ohms, L is approximately in a range of 0.1 to 15 µH (micro Henrys).

8. The method of claim 7, wherein C is at or about 100 to 250 pF, R is at or about 1000 to 2000 ohms and L is at or about 6 to 8 uH.

9. The method of claim 3, wherein the program simulator is a modified SPICE program.

10. A method of estimating current leakage of an electrostatic discharge (ESD) circuit using a program simulator, comprising:
populating characteristics of a Human Body Model (HBM), a designed ESD device in communication with the HBM, and an associated semiconductor device under test (DUT), into the program simulator,
simulating current flow through at least two or more circuit paths as between a positive supply voltage ($V_{CC}$) of the HBM and the ground point, a first input/output (I/O) point and a second I/O point of the DUT, and one of the I/O points of the DUT and the ground point, and
determining a current leakage as an average difference between the simulated current flow through the at least two or more circuit paths and a minimum current threshold for the DUT; wherein if a current through the at least two or more circuit paths is above the minimum current threshold the current is unacceptably significant and the DUT fails.

11. The method of claim 10, wherein when the determined current leakage is greater than zero, the ESD circuit fails.

12. The method of claim 10, wherein when the determined current leakage is greater than 100uA, the ESD circuit fails.

13. The method of claim 12, wherein characteristics of the HBM model include a resistor (R), an inductor (L), and a capacitor (C), configured in circuit communication where C is approximately in a range from 80 to 300 pF, R is approximately in a range of 800 to 3000 ohms, L is approximately in a range of 0.1 to 15 µH (micro Henrys).

14. The method of claim 13, wherein C is at or about 100 to 250 pF, R is at or about 1000 to 2000 ohms and L is at or about 6 to 8 uH.

15. The method of claim 14, wherein the program simulator is a modified SPICE program.

16. A computer program product for passing or failing an electrostatic discharge (ESD) circuit using a program simulator and an ESD model, the computer program product comprising a non-transitory computer-readable storage medium having computer-readable program code portions stored therein, the computer-readable program code portions comprising: a first executable portion having instructions providing a capability of: populating characteristics of the ESD model and an associated semiconductor device into the program simulator,
determining a minimum current threshold for the ESD model,
executing the program simulator to determine the simulated current across the ESD model as through two or more predetermined circuit paths, and,
comparing the determined simulated current of the two or more circuit paths to the minimum current threshold, wherein if a current through the two or more circuit paths is above the minimum current threshold the current is unacceptably significant and the ESD circuit fails.

17. The product of claim 16, wherein the ESD model further comprises an ESD circuit and one of a Human Body Model (HBM), a Machine Model (MM), or a Charged Device Model (CDM).

18. The product of claim 16, wherein the ESD model is a Human Body Model (HBM) in communicative arrangement with an ESD circuit, and the semiconductor device is an integrated circuit (IC) design having IC characteristics.

19. The product of claim 18, further comprising, returning a FAIL state where the determined simulated current is significantly less than the minimum current threshold or returning a PASS state where the determined simulated current is equal or very close to the minimum current threshold.

20. The product of claim 18, further comprising, returning a PASS state where the determined simulated current is no more than approximately 100 micro amps less than the minimum current threshold.

21. The product of claim 18, wherein the one or more predetermined circuit paths are as between the positive supply voltage (VCC) of the ESD model and the ground point, a first input/output (I/O) point and a second I/O point of the IC, and one of the I/O points of the IC and the ground point.

22. The product of claim 18, wherein characteristics of the HBM model include a resistor (R), an inductor (L), and a capacitor (C), configured in circuit communication where C is approximately in a range from 80 to 300 pF, R is approximately in a range of 800 to 3000 ohms, L is approximately in a range of 0.1 to 15 µH (micro Henrys).

23. The product of claim 22, wherein C is at or about 100 to 250 pF, R is at or about 1000 to 2000 ohms and L is at or about 6 to 8 uH.

24. The product of claim 18, wherein the program simulator includes one or more scripts of a modified SPICE program.

25. The product of claim 18, further comprising the step of identifying one or more weak links in the ESD circuit where the simulator returned a FAIL state.

* * * * *